US009182662B2

(12) United States Patent
Ongayi et al.

(10) Patent No.: US 9,182,662 B2
(45) Date of Patent: Nov. 10, 2015

(54) PHOTOSENSITIVE COPOLYMER, PHOTORESIST COMPRISING THE COPOLYMER, AND ARTICLES FORMED THEREFROM

(71) Applicants: Owendi Ongayi, Marlborough, MA (US); James W. Thackeray, Braintree, MA (US)

(72) Inventors: Owendi Ongayi, Marlborough, MA (US); James W. Thackeray, Braintree, MA (US)

(73) Assignee: ROHM AND HAAS ELECTRONIC MATERIALS LLC, Marlborough, MA (US)

(*) Notice: Subject to any disclaimer, the term of this patent is extended or adjusted under 35 U.S.C. 154(b) by 81 days.

(21) Appl. No.: 13/752,523

(22) Filed: Jan. 29, 2013

(65) Prior Publication Data
US 2013/0209934 A1 Aug. 15, 2013

Related U.S. Application Data

(60) Provisional application No. 61/599,421, filed on Feb. 15, 2012.

(51) Int. Cl.
*C08F 220/22* (2006.01)
*G03F 7/039* (2006.01)
*G03F 7/20* (2006.01)
*G03F 7/004* (2006.01)

(52) U.S. Cl.
CPC .............. *G03F 7/004* (2013.01); *C08F 220/22* (2013.01); *G03F 7/0046* (2013.01); *G03F 7/0392* (2013.01); *G03F 7/0397* (2013.01)

(58) Field of Classification Search
CPC ....... G03F 7/004; G03F 7/039; G03F 7/0392; G03F 7/0395; G03F 7/20; G03F 7/26; C08F 220/22; C08F 220/24
USPC .................. 430/270.1, 326, 910; 526/245
See application file for complete search history.

(56) References Cited

U.S. PATENT DOCUMENTS

| | | | |
|---|---|---|---|
| 6,313,245 B1 * | 11/2001 | Moore et al. | 526/243 |
| 7,569,326 B2 * | 8/2009 | Ohsawa et al. | 430/270.1 |
| 8,609,889 B2 | 12/2013 | Ohashi et al. | |
| 2002/0106581 A1 * | 8/2002 | Mizutani et al. | 430/270.1 |
| 2003/0134224 A1 * | 7/2003 | Mizutani et al. | 430/270.1 |
| 2003/0232274 A1 | 12/2003 | Barclay et al. | |
| 2004/0018445 A1 | 1/2004 | Akita et al. | |
| 2005/0059256 A1 * | 3/2005 | Watanabe | 438/725 |
| 2008/0311507 A1 | 12/2008 | Isono et al. | |
| 2009/0170029 A1 | 7/2009 | Choi et al. | |
| 2010/0129738 A1 | 5/2010 | Takemura et al. | |
| 2010/0304302 A1 | 12/2010 | Masunaga et al. | |
| 2010/0310987 A1 * | 12/2010 | Maruyama et al. | 430/270.1 |
| 2011/0159429 A1 | 6/2011 | Thackeray et al. | |
| 2011/0189607 A1 | 8/2011 | Ohashi et al. | |
| 2011/0200941 A1 | 8/2011 | Masunaga et al. | |
| 2011/0294070 A1 | 12/2011 | Hatakeyama et al. | |
| 2013/0084527 A1 * | 4/2013 | Hatakeyama et al. | 430/283.1 |

FOREIGN PATENT DOCUMENTS

| | | | |
|---|---|---|---|
| JP | 2002-249520 | * | 9/2002 |
| WO | 2009011364 A1 | | 1/2009 |
| WO | WO 2012/002519 | * | 1/2012 |

OTHER PUBLICATIONS

Machine translation of JP 2002-249520 published on Sep. 6, 2002.*
International Publication No. 2009011364 (A1); Publication Date: Jan. 22, 2009; Abstract Only, 2 pages.
Ichihiro Aratani et al., "Evaluation of Novel Resist Materials for EUV Lithography" Laboratory of Advanced Science and Technology for Industry, University of Hyogo; Proc. of SPIE vol. 7273, 2009, 7 pages.
Roel Gronheid et al., "EUV Resist Requirements: Absorbance and Acid Yield" Advances in Resist Materials and Processing Technology XXVI, Proc. of SPIE vol. 7273, 2009; 8 pages.
M.S. Kitai et al., "Increasing of the EUV resist's sensitivity" Fundamentals of Laser-Assisted Micro-and Nanotechnologies 2010, Proc. of SPIE vol. 7996, 799612; 10 pages.
Julius Joseph Santillan et al., "Fluorinated-Polymer Based High Sensitivity Extreme Ultraviolet Resists" Japanese Journal of Applied Physics 49 (2010) 06GF01, 7 pages.

(Continued)

*Primary Examiner* — Anca Eoff
(74) *Attorney, Agent, or Firm* — Cantor Colburn LLP (57) ABSTRACT

A copolymer comprising the polymerized product of an electron-sensitizing acid deprotectable monomer, such as the monomer having the formula (XX), and a comonomer:

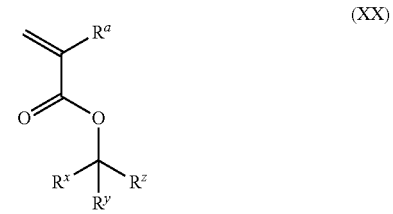

(XX)

wherein $R^a$ is H, F, —CN, $C_{1-10}$ alkyl, or $C_{1-10}$ fluoroalkyl; $R^x$ and $R^y$ are each independently a substituted or unsubstituted $C_{1-10}$ alkyl group or $C_{3-10}$ cycloalkyl group; $R^z$ is a substituted or unsubstituted $C_{6-20}$ aromatic-containing group or $C_{6-20}$ cycloaliphatic-containing group; wherein $R^x$ and $R^y$ together optionally form a ring; and wherein at least one of $R^x$, $R^y$ and $R^z$ is halogenated. A photoresist and coated substrate comprising the copolymer, and a method of making an electronic device using the photoresist, are also disclosed.

11 Claims, 1 Drawing Sheet

(56) References Cited

OTHER PUBLICATIONS

Takashi Sasaki et al., "Development of partially fluorinated EUV-resist polymers for LER and sensitivity improvement" Advances in Resist Materials and Processing Technology XXV, Proc. of SPIE vol. 6923, 2008; 7 pages.

Tsutomu Shoki et al., "Recent Progress in EUV Blanks Development" Journal of Photopolymer Science and Technology, vol. 23, No. 5 (2010) 619-624; 6 pages.

Hiroki Yamamoto et al., "Enhancement of Acid Production in Chemically Amplified Resist for Extreme Ultraviolet Lithography" Applied Physics Express 1 (2008) 0470001.

Tsuneo Yamashita et al., "High-sensitivity EUV resists based on fluorinated polymers" Advances in Resist Materials and Processing Technology XXVIII, Proc. of SPIE, vol. 7972, (2011) 79721G, 13 pages.

* cited by examiner

FIG. 1

Comparative Example     Polymer A     Polymer B

PHOTOSENSITIVE COPOLYMER, PHOTORESIST COMPRISING THE COPOLYMER, AND ARTICLES FORMED THEREFROM

BACKGROUND

Disclosed herein are a novel photosensitive copolymer, a photoresist incorporating the copolymer, and a method of making a pattern from the photoresist.

EUV (Extreme Ultraviolet) photoresist development continues to be a challenging issue for EUVL (EUV Lithography) technology implementation. Development of materials that are not only high resolution (i.e., resolving features of 22 nm at half pitch) and with a low linewidth roughness (LWR) of less than 1.8 nm, but sensitive enough to afford high wafer through put are required (i.e., 10-15 mJ/cm$^2$).

For EUV photoresist material and polymer design, a very important consideration is EUV absorption. Polymers widely used for EUV platform are ionized by high energy (13.4 nm) light and release high energy electrons. The high energy electron is trapped by the photoacid generator through reductive electron transfer and activates the PAG to generate acid.

EUV sensitivity is also determined by photo speed, which may be increased by varying the concentration and or efficiency of photoacid generators (PAGs) in the resist, optimizing the number of acid-labile protecting groups on a polymer backbone, engineering the polymer protecting groups, or reducing the base quencher amounts. Sasaki et al. ("Development of partially fluorinated EUV-resist polymers for LER and sensitivity improvement," T. Sasaki, O. Yokokoji, T. Watanabe and H. Kinoshita, Proc. SPIE V. 6923, 692347, (2008)) disclose introducing halogen atoms into polymers enhances acid generation yield and resist sensitivity in EUV systems, due to an increase in the absorption coefficient by the halogens which are high absorbing EUV elements. This additional absorption can make for efficient use of the incident energy in EUV lithography.

STATEMENT OF THE INVENTION

The above and other deficiencies of the prior art may be overcome by a copolymer comprising the polymerized product of: an electron-sensitizing acid deprotectable monomer having the formula (XX) and a comonomer:

(XX)

wherein $R^a$ is H, F, —CN, $C_{1-10}$ alkyl, or $C_{1-10}$ fluoroalkyl; $R^x$ and $R^y$ are each independently a substituted or unsubstituted $C_{1-10}$ alkyl group or $C_{3-10}$ cycloalkyl group; $R^z$ is a substituted or unsubstituted $C_{6-20}$ aromatic-containing group or $C_{6-20}$ cycloaliphatic-containing group; wherein $R^x$ and $R^y$ together optionally form a ring; and wherein at least one of $R^x$, $R^y$ and $R^z$ are halogenated.

Another embodiment is a copolymer comprising the polymerized product of: an electron-sensitizing monomer having the formula (I) and a comonomer:

(I)

wherein each $R^a$ is independently H, F, —CN, $C_{1-10}$ alkyl, or $C_{1-10}$ fluoroalkyl, $S^1$ is a cyclic or acyclic, aromatic or non-aromatic $C_{3-20}$ tertiary group, and $A^1$ is substituted or unsubstituted and is a fluorinated $C_{6-20}$ aromatic-containing group, a fluorinated $C_{6-20}$ cycloaliphatic-containing group, or a combination comprising at least one of the foregoing.

A photoresist comprises the copolymer, and can further include a photoacid generator compound.

A coated substrate comprises: (a) a substrate having one or more layers to be patterned on a surface thereof; and (b) a layer of a photoresist composition over the one or more layers to be patterned.

A method of forming an electronic device, comprises: (a) applying a layer of a photoresist composition on a substrate; (b) patternwise exposing the photoresist composition layer to activating radiation; (c) developing the exposed photoresist composition layer to provide a resist relief image, and (d) etching the resist relief pattern into the underlying substrate.

BRIEF DESCRIPTION OF THE DRAWINGS

The foregoing and other objects, features, and advantages of the invention are apparent from the following detailed description taken in conjunction with the accompanying drawings in which.

DETAILED DESCRIPTION OF THE INVENTION

Disclosed herein is a novel copolymer incorporating acid-deprotectable electron-sensitizing groups based on a radically polymerizable (meth)acrylate type monomer. The acid deprotectable electron sensitizing monomers have a tertiary alkyl spacer structure which allows ready deprotection of the group in the presence of acid, and includes a pendant aromatic ring having halogenated EUV chromophores (e.g., fluorine groups) or where the spacer itself includes the halogenated chromophores, or both. The copolymer further includes a photoacid generating monomer based on onium cations, acid-deprotectable monomer, base soluble monomer, and a lactone-containing monomer. The copolymer has improved LWR and enhanced resolution capable of reaching sub-22 nm feature sizes.

As used herein "onium" refers to iodonium or sulfonium cations. Also as used herein, "substituted" means including a substituent such as a halogen (i.e., F, Cl, Br, I), hydroxy, amino, thiol, carboxyl, carboxylate, amide, nitrile, thiol, sulfide, disulfide, nitro, a $C_{1-10}$ alkyl, a $C_{1-10}$ alkoxy, a $C_{6-10}$ aryl, a $C_{6-10}$ aryloxy, a $C_{7-10}$ alkyl aryl, a $C_{7-10}$ alkyl aryloxy, or a combination comprising at least one of the foregoing. It will be understood that any group or structure disclosed with respect to the formulas herein may be so substituted unless otherwise specified, or where such substitution would significantly adversely affect the desired properties of the resulting structure. Also, "(meth)acrylate," as used herein, means either acrylate or methacrylate, and is not limited to either of these unless otherwise specified. In addition, "fluorinated" means having one or more fluorine atoms incorporated into the feature, e.g., where a $C_{1-10}$ fluoroalkyl group is indicated, the group includes a single fluorine atom, a difluoromethylene group, a trifluoromethyl group, a combination of these, or is a perfluorinated group (e.g., $CF_3$, $C_2F_5$, $C_3F_7$, $C_4F_9$, etc.). "Perfluoro" as used herein, means where greater than 70%, preferably greater than 80%, more preferably greater than 90%, and still more preferably greater than 95% of all available nonstructural valencies in the group have fluorine atoms.

In some embodiments, the copolymer comprises the polymerized product of an electron-sensitizing monomer having the formula (I) and a comonomer:

(I)

wherein each $R^a$ is independently H, F, —CN, —CN, $C_{1-10}$ alkyl, or $C_{1-10}$ fluoroalkyl, $S^1$ is a cyclic or acyclic, aromatic or nonaromatic $C_{3-20}$ tertiary group (i.e., a $C_{3-20}$ group in which a tertiary carbon atom is bound to the adjacent ester oxygen atom), and $A^1$ is substituted or unsubstituted and is a fluorinated $C_{6-20}$ aromatic-containing group, a fluorinated $C_{6-20}$ cycloaliphatic-containing group, or a combination comprising at least one of the foregoing. Exemplary such aromatic groups include phenyl, naphthyl, fluorenyl, biphenyl, and exemplary cycloaliphatic groups include simple cycloalkyl groups such as cyclopentyl and cyclohexyl, or polycyclic aliphatics such as norbornenyl groups and adamantyl groups. Preferably, $A^1$ is substituted or unsubstituted and is a fluorinated $C_{6-20}$ aromatic-containing group.

In some embodiments, the electron sensitizing monomer has formula (II):

(II)

wherein $R^a$ is H, F, —CN, $C_{1-10}$ alkyl, or $C_{1-10}$ fluoroalkyl, each $R^c$ is independently $C_{1-10}$ alkyl or $C_{3-10}$ cycloalkyl, $S^2$ is a single bond, a $C_{1-10}$ alkylene group, or a $C_{3-10}$ cycloalkylene group, and $A^2$ is a $C_{6-10}$ aryl group or a $C_{7-10}$ aralkyl group, wherein $A^2$ is fluorinated or is substituted with a $C_{1-4}$ fluoroalkyl group.

In some embodiments, the electron sensitizing monomer has formula (III) or (IV):

wherein each $R^a$ is independently H, F, —CN, $CH_3$, or $CF_3$, $R^c$ is $C_{1-10}$ cycloalkyl or $C_{3-10}$ cycloalkyl, $R^d$, $R^e$, $R^f$, and $R^g$ are independently $C_{1-6}$ perfluoroalkyl or $C_{3-6}$ perfluorocycloalkyl, $S^2$ is a single bond, a $C_{1-10}$ alkylene group, or a $C_{3-10}$ cycloalkylene group, x is an integer of from 1 to 20, y is an integer of from 1 to 20, m is an integer of from 0 to 5, n is an integer of from 1 to 5, and p is an integer of from 0 to 2x+6.

Exemplary electron sensitizing monomers include those having the following formulas (IIIa) and (IVa):

wherein each $R^a$ is H, F, —CN, $CH_3$, or $CF_3$ and x is an integer of from 0 to 19, and y is an integer of from 1 to 20.

Another embodiment is a copolymer of an electron-sensitizing acid deprotectable monomer having the formula (XIV) and a comonomer:

(XIV)

wherein $R^a$ is H, F, —CN, $C_{1-10}$ alkyl, or $C_{1-10}$ fluoroalkyl; $S^1$ is a cyclic or acyclic, aromatic or nonaromatic, halogenated or unhalogenated $C_{3-20}$ tertiary group; $A^1$ is substituted or unsubstituted and is a halogenated or unhalogenated $C_{6-20}$ aromatic-containing group, a halogenated or unhalogenated $C_{6-20}$ cycloaliphatic-containing group, or a combination comprising at least one of the foregoing; wherein at least one of $S^1$ and $A^1$ is halogenated.

In some embodiments, the copolymer comprises the polymerized product of: an electron-sensitizing acid deprotectable monomer having the formula (XX) and a comonomer:

(XX)

wherein $R^a$ is H, F, —CN, $C_{1-10}$ alkyl, or $C_{1-10}$ fluoroalkyl; $R^x$ and $R^y$ are each independently a substituted or unsubstituted $C_{1-10}$ alkyl group or $C_{3-10}$ cycloalkyl group; $R^z$ is a substituted or unsubstituted $C_{6-20}$ aromatic-containing group or $C_{6-20}$ cycloaliphatic-containing group; wherein $R^x$ and $R^y$ together optionally form a ring; and wherein at least one of $R^x$, $R^y$ and $R^z$ are halogenated. In some embodiments, at least one of $R^x$, $R^y$, and $R^z$ is fluorinated. In some embodiments, wherein $R^z$ is a substituted or unsubstituted $C_{6-20}$ aromatic-containing group. In some embodiments, the electron-sensitizing acid-deprotectable monomer comprises or a combination thereof.

In some embodiments, the comonomer used to form the copolymer comprises at least one of the following monomers: an acid-deprotectable monomer having the formula (V), a lactone-containing monomer of the formula (VI), a base-soluble monomer of formula (VII) for adjusting dissolution rate in alkaline developer, a photoacid-generating monomer of the formula (VIII), or a combination comprising at least one of the foregoing monomers:

(V)

(VI)

(VII)

(VIII)

wherein each $R^a$ is independently H, F, —CN, $C_{1-10}$ alkyl, or $C_{1-10}$ fluoroalkyl. In the acid-deprotectable monomer of formula (V), each $R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to an adjacent $R^b$ to form a cyclic structure. In lactone-containing monomer of formula (VI), L is a monocyclic, polycyclic, or fused polycyclic $C_{4-20}$ lactone-containing group. In the base solubilizing monomer of formula (VII), W is a halogenated or non-halogenated, aromatic or non-aromatic $C_{2-50}$ hydroxyl-containing organic group having a pKa of less than or equal to 12. In the photoacid generating monomer of formula (VIII), Q is ester-containing or non-ester containing and fluorinated or non-fluorinated and is $C_{1-20}$ alkylene, $C_{3-20}$ cycloalkylene, $C_{6-20}$ arylene, or $C_{7-20}$ aralkylene group, A is ester-containing or non-ester-containing and fluorinated or non-fluorinated, and is $C_{1-20}$ alkylene, $C_{3-20}$ cycloalkylene, $C_{6-20}$ arylene, or $C_{7-20}$ aralkylene, $Z^-$ is an anionic moiety comprising sulfonate, an anion of a sulfonamide, or an anion of a sulfonimide, and $G^+$ is a sulfonium or iodonium cation.

The acid deprotectable monomer is any acid-deprotectable monomer not identical to the electron sensitizing monomer. Exemplary such acid-deprotectable monomers include but are not limited to:

-continued or a combination comprising at least one of the foregoing monomers, wherein $R^a$ is H, F, —CN, $C_{1-10}$ alkyl, or $C_{1-10}$ fluoroalkyl.

The base-soluble monomer is preferably of formula (X):

(X)

wherein $R^a$ is H, F, —CN, $C_{1-10}$ alkyl, or $C_{1-10}$ fluoroalkyl; A is a hydroxyl-containing or non-hydroxyl containing, ester-containing or non ester-containing, fluorinated or non-fluorinated $C_{1-20}$ alkylene, $C_{3-20}$ cycloalkylene, $C_{6-20}$ arylene, or $C_{7-20}$ aralkylene, or A is hydroxyl-containing $C_{6-20}$ aryl; and x is an integer of from 0 to 4, wherein when x is 0, A is a hydroxyl-containing $C_{6-20}$ aryl.

or a combination comprising at least one of the foregoing, wherein $R^a$ is H, F, —CN, $C_{1-6}$ alkyl, or $C_{1-6}$ fluoroalkyl.

The lactone monomer is preferably of formula (IX):

(IX)

wherein $R^a$ is H, F, —CN, $C_{1-6}$ alkyl, or $C_{1-6}$ fluoroalkyl, R is a $C_{1-10}$ alkyl, cycloalkyl, or heterocycloalkyl, and w is an integer of 0 to 6. In formula (IX), R is attached directly to the lactone ring or commonly attached to the lactone ring and/or one or more other R groups, and the ester moiety is attached to the lactone ring directly, or indirectly through R.

Exemplary lactone-containing monomers include, but are not limited to:

Exemplary base soluble monomers include those having the following structures, but are not limited to:

-continued or a combination comprising at least one of the foregoing, wherein $R^a$ is H, F, —CN, $C_{1-6}$ alkyl, or $C_{1-6}$ fluoroalkyl.

In some embodiments, the comonomer comprises a photoacid generating monomer having formula (XI) or (XII):

(XI)

(XII)

wherein each $R^a$ is independently H, F, —CN, $C_{1-6}$ alkyl, or $C_{1-6}$ fluoroalkyl, A is a fluorine-substituted $C_{1-30}$ alkylene group, a fluorine-substituted $C_{3-30}$ cycloalkylene group, a fluorine-substituted $C_{6-30}$ arylene group, or a fluorine-substituted $C_{7-30}$ aralkylene group, and G' is a sulfonium or iodonium cation.

Preferably, in formulas (XI) and (XII), A is a —[(C($R^1$)$_2$)$_x$C(=O)O]$_b$—(C($R^2$)$_2$)$_y$(CF$_2$)$_z$— group, or an o-, m- or p-substituted —$C_6F_4$— group, where each $R^1$ and $R^2$ are each independently H, F, —CN, $C_{1-6}$ fluoroalkyl, or $C_{1-6}$ alkyl, b is 0 or 1, x is an integer of 1 to 10, y and z are independently integers of from 0 to 10, and the sum of y+z is at least 1.

Exemplary photoacid generating monomers include:

or a combination comprising at least one of the foregoing, where each $R^a$ is independently H, F, —CN, $C_{1-6}$ alkyl, or $C_{1-6}$ fluoroalkyl, and $G^+$ is a sulfonium or iodonium cation.

The photoacid-generating monomer includes a sulfonium or iodonium cation. Preferably, in formula (IV), $G^+$ is of the formula (XIII):

(XIII)

wherein X is S or I, each $R^0$ is halogenated or non-halogenated and is independently $C_{1-30}$ alkyl group; a polycyclic or monocyclic $C_{3-30}$ cycloalkyl group; a polycyclic or monocyclic $C_{4-30}$ aryl group; or a combination comprising at least one of the foregoing, wherein when X is S, one of the $R^0$ groups is optionally attached to one adjacent $R^0$ group by a single bond, wherein when X is I, a is 2, or when X is S, a is 3.

Exemplary photoacid generating monomers include, but are not limited to, those having the formulas:

-continued wherein $R^a$ is H, F, —CN, $C_{1-6}$ alkyl, or $C_{1-6}$ fluoroalkyl.

The copolymer is used to prepare a photoresist. The photoresist may include, alternatively or in addition to the photoacid generating monomer, a non monomeric PAG compound; optionally an additional polymer; additives including for example a photo-destroyable base, and a surfactant. Other additives, such as dissolution rate inhibitors, sensitizers, additional PAGs, etc. may also be included. The photoresist components are dissolved in solvent for dispense and coating.

The photoresist may include a photo-destroyable base. Inclusion of base materials, preferably the carboxylate salts of photo-decomposable cations, provides a mechanism for neutralization of acid from the acid decomposable groups, and limits the diffusion of the photogenerated acid, to thereby provide improved contrast in the photoresist.

Photo-destroyable bases include photo-decomposable cations, and preferably those also useful for preparing PAGs, paired with an anion of an organic acid such as, for example, a $C_{1-20}$ carboxylic or sulfonic acid. Exemplary such carboxylic acids include formic acid, acetic acid, propionic acid, tartaric acid, succinic acid, cyclohexylcarboxylic acid, benzoic acid, salicylic acid, and other such carboxylic acids. Exemplary sulfonic acids include methansulfonic acid, toluenesulfonic acid, cyclohexanesulfonic acid, camphorsulfonic acid, and other such sulfonic acids. Photo-destroyable bases include cation/anion pairs of the following structures, and the cation is triphenylsulfonium or one of the following:

where R is independently H, a $C_{1-20}$ alkyl, a $C_{6-20}$ aryl, or a $C_{6-20}$ alkyl aryl, and the anion is where R is independently H, a $C_{1-20}$ alkyl, a $C_{1-20}$ alkoxy, a $C_{3-20}$ cycloalkyl, a $C_{3-20}$ cycloalkoxy, a $C_{6-20}$ aryl, or a $C_{6-20}$ alkyl aryl. Other photo-destroyable bases include those based on non-ionic photo-decomposing chromophores such as, for example, 2-nitrobenzyl groups and benzoin groups. An exemplary photobase generator is ortho-nitrobenzyl carbamate.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as Troger's base, a hindered amine such as diazabicycloundecene (DBU) or diazabicyclononene (DBM), or ionic quenchers including quaternary alkyl ammonium salts such as tetrabutylammonium hydroxide (TBAH) or tetrabutyl ammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432, available from 3M Corporation; and fluorodiols such as POLYFOX PF-636, PF-6320, PF-656, and PF-6520 fluorosurfactants from Omnova.

The photoresist further includes a solvent generally suitable for dissolving, dispensing, and coating the components used in a photoresists. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

The photoresist composition disclosed herein may include the copolymer in an amount of 50 to 99 wt %, specifically 55 to 95 wt %, more specifically 60 to 90 wt %, and still more specifically 65 to 90 based on the total weight of solids. It will be understood that "copolymer" used in this context of a component in a photoresist may mean only the copolymer disclosed herein, or a combination of the copolymer with another polymer useful in a photoresist. The photo-destroyable base may be present in the photoresist in an amount of 0.01 to 5 wt %, specifically 0.1 to 4 wt %, and still more specifically 0.2 to 3 wt %, based on the total weight of solids. A surfactant may be included in an amount of 0.01 to 5 wt %, specifically 0.1 to 4 wt %, and still more specifically 0.2 to 3 wt %, based on the total weight of solids. A quencher may be included in relatively small amounts of for example, from 0.03 to 5 wt % based on the total weight of solids. Other additives may be included in amounts of less than or equal to 30 wt %, specifically less than or equal to 20%, or more specifically less than or equal to 10%, based on the total weight of solids. The total solids content for the photoresist composition may be 0.5 to 50 wt %, specifically 1 to 45 wt %, more specifically 2 to 40 wt %, and still more specifically 5 to 35 wt %, based on the total weight of solids and solvent. It will be understood that the solids includes copolymer, photo-destroyable base, quencher, surfactant, any added PAG, and any optional additives, exclusive of solvent.

A coated substrate may be formed from the photoresist containing the polymer-bound PAG. Such a coated substrate includes: (a) a substrate having one or more layers to be patterned on a surface thereof; and (b) a layer of the photoresist composition including the polymer-bound PAG over the one or more layers to be patterned.

Substrates may be any dimension and shape, and are preferably those useful for photolithography, such as silicon, silicon dioxide, silicon-on-insulator (SOI), strained silicon, gallium arsenide, coated substrates including those coated with silicon nitride, silicon oxynitride, titanium nitride, tantalum nitride, ultrathin gate oxides such as hafnium oxide, metal or metal coated substrates including those coated with titanium, tantalum, copper, aluminum, tungsten, alloys thereof, and combinations thereof. Preferably, the surfaces of substrates herein include critical dimension layers to be patterned including, for example, one or more gate-level layers or other critical dimension layer on the substrates for semiconductor manufacture. Such substrates may preferably include silicon, SOI, strained silicon, and other such substrate materials, formed as circular wafers having dimensions such as, for example, 20 cm, 30 cm, or larger in diameter, or other dimensions useful for wafer fabrication production.

Further, a method of forming an electronic device includes (a) applying a layer of a photoresist composition including on a surface of the substrate; (b) patternwise exposing the photoresist composition layer to activating radiation; and (c) developing the exposed photoresist composition layer to provide a resist relief image. The method further includes (d) etching the resist relief pattern into the underlying substrate.

Applying may be accomplished by any suitable method, including spin coating, spray coating, dip coating, doctor blading, or the like. Applying the layer of photoresist is preferably accomplished by spin-coating the photoresist in solvent using a coating track, in which the photoresist is dispensed on a spinning wafer. During dispense, the wafer may be spun at a speed of up to 4,000 rpm, preferably from 500 to 3,000 rpm, and more preferably 1,000 to 2,500 rpm. The coated wafer is spun to remove solvent, and baked on a hot plate to remove residual solvent and free volume from the film to make it uniformly dense.

Patternwise exposure is then carried out using an exposure tool such as a stepper, in which the film is irradiated through a pattern mask and thereby is exposed pattern-wise. The method preferably uses advanced exposure tools generating activating radiation at wavelengths capable of high resolution including extreme-ultraviolet (EUV) or e-beam radiation. It will be appreciated that exposure using the activating radiation decomposes the PAG in the exposed areas and generates acid and decomposition by-products, and that the acid then effects a chemical change in the polymer (deblocking the acid sensitive group to generate a base-soluble group, or alternatively, catalyzing a cross-linking reaction in the exposed areas). The resolution of such exposure tools may be less than 30 nm.

Developing the exposed photoresist layer is then accomplished by treating the exposed layer to a suitable developer capable of selectively removing the exposed portions of the film (where the photoresist is positive tone) or removing the unexposed portions of the film (where the photoresist is crosslinkable in the exposed regions, i.e., negative tone). In some embodiments, the photoresist is positive tone based on a polymer having acid sensitive (deprotectable) groups, and the developer is preferably a metal-ion free tetraalkylammonium hydroxide solution, such as, for example, aqueous 0.26 N tetramethylammonium hydroxide. Alternatively, negative tone development (NTD) can be conducted by use of a suitable organic solvent developer. NTD results in the removal of unexposed regions of the photoresist layer, leaving behind exposed regions due to polarity reversal of those regions. Suitable NTD developers include, for example, a solvent chosen from ketones, esters, ethers, hydrocarbons, and mixtures thereof. Other suitable solvents include those used in the photoresist composition. In some embodiments, the developer is 2-heptanone or a butyl acetate such as n-butyl acetate. Whether the development is positive tone or negative tone, a pattern forms by developing.

The photoresist may, when used in one or more such a pattern-forming processes, be used to fabricate electronic and optoelectronic devices such as memory devices, processor chips (CPU's), graphics chips, and other such devices.

The invention is further illustrated by the following examples. All compounds and reagents used herein are available commercially except where a procedure is provided below.

Structural characterization was carried out by nuclear magnetic resonance (NMR) spectrometry on an INOVA 500 NMR Spectrometer with OMNI-PROBE (operating at 500 MHz for proton) or GEMINI 300 NMR Spectrometer (operating at 282 MHz for fluorine), each from Varian. Polymer composition was determined by quantitative $^{13}$C NMR at 125 MHz using NOE suppression techniques (i.e., Cr(acetylacetonate)$_3$ and a pulse delay of >5 seconds). Molecular weight (Mw) and polydispersity (PD) were determined by gel permeation chromatography (GPC) using a sample concentration of 1 mg/ml and a crosslinked styrene-divinylbenzene column with universal calibration curve calibrated with polystyrene standards, and eluted with tetrahydrofuran at a flow rate of 1 ml/min.

Two different leaving group monomers (electron sensitizing monomers LG1 and LG2) were prepared according to the following procedures.

Leaving Group 1 (LG1), shown in Scheme 1, was prepared as follows.

Scheme 1

Synthesis of 1-(3,5-bis(trifluoromethyl)benzyl)cyclopentyl methacrylate (n=1, X=CF$_3$ in Scheme 1). In a 300 mL three necked oven dried round bottom flask equipped with a magnetic stirrer, 25 g of 2-(3,5-bis(trifluoromethyl)phenyl) acetic acid (1, X is CF$_3$) and 13.97 g of potassium carbonate (K$_2$CO$_3$) were suspended in 100 mL of dioxane and the mixture stirred at room temperature for 1 hour, forming a thick slurry. 12.91 g of methyl iodide dissolved in 10 mL of dioxane was slowly added to the reaction mixture using a dropping funnel over a period of hours and the reaction refluxed overnight for an additional 12 hr until completion was ascertained by TLC analysis (1:99 methanol/chloroform). The reaction was quenched by pouring the mixture slowly into 400 mL of 0.01% hydrochloric acid (HCl) solution, extracted into 300 mL of ethyl acetate, washed with water and brine to a neutral pH. The ethyl acetate extracts were then dried over sodium sulfate, filtered and concentrated in the rotary evaporator affording 26 g (~99%) yield of methyl 2-(3,5-bis(trifluoromethyl)phenyl)acetate (2) as a solid. The product was used without further purification. $^1$H NMR (500 MHz, Acetone-d$_6$): δ 7.99 (s, 1H), 7.93 (s, 2H), 3.97 (s, 2H), 3.67 (s, 3H).

A 500 mL round bottom flask equipped with a magnetic stirrer was charged with 20 g of magnesium metal and 100 mL of tetrahydrofuran and flushed with nitrogen for an hour. 34 mL of 1,4-dibromobutane was slowly charged into the reactor via a dropping funnel at room temperature and allowed to stir at this temperature till the effervescence stopped and the confirming the formation of the Grignard. 45 g of methyl 2-(3,5-bis(trifluoromethyl)phenyl)acetate (2) dissolved in tetrahydrofuran (THF) was then slowly to this Grignard reagent for 1 hour and upon completion allowed to stir at room temperature for 4 hours. The reaction was quenched by slowly pouring the mixture into 1000 mL saturated ammonium chloride solution and extracted into 1000 mL of ethyl acetate, and washed with water and brine to a neutral pH. The ethyl acetate extracts were then dried over sodium sulfate, filtered and concentrated in the rotary evaporator affording 43 g of 1-(3,5-bis(trifluoromethyl)benzyl)cyclopentanol (~95%) yield of as an amber oil which was used without further purification. $^1$H NMR (500 MHz, Acetone-$d_6$): δ 7.93 (s, 1H), 7.83 (s, 2H), 3.61 (broad, s, 1H, OH), 3.06 (s, 3H), 1.80-1.42 (m, 8H).

43 g of 1-(3,5-bis(trifluoromethyl)benzyl)cyclopentanol and 16.7 g of triethylamine dissolved in 100 mL of methylene chloride was slowly charged into flask equipped with magnetic stirrer and 14.93 mL of methacryloyl chloride in 100 mL of dichloromethane cooled down to 0° C. The resultant mixture slowly warmed up to room temperature and allowed to stir at this temperature for 12 hours. Upon completion of the reaction as confirmed by thin layer chromatography, the mixture was quenched by pouring into 400 mL of deionized water and extracted further into methylene chloride. The methylene chloride extracts were then dried over sodium sulfate, filtered and concentrated in the rotary evaporator affording 34 g of 1-(3,5-bis(trifluoromethyl)benzyl)cyclopentyl methacrylate (~65%) yield of as an amber oil. The oil was purified further by passing through a silica gel plug eluting with a 60/40 mixture of hexanes/methylene chloride affording 30 g of 1-(3,5-bis(trifluoromethyl)benzyl)cyclopentyl methacrylate (LG1) as pure product. $^1$H NMR (500 MHz, Acetone-$d_6$): δ 7.97 (s, 1H), 7.76 (s, 2H), 5.99 (s, 1H, vinyl), 5.6 (s, 1H, vinyl), 3.56 (s, 2H), 2.23-1.70 (m, 8H), 1.80 (s, 3H).

Leaving Group 2 (LG2), shown in Scheme 2 (where n=1 and y is $CF_3$), was prepared as follows.

In a 500 mL three necked oven dried round bottom flask equipped with a magnetic stirrer and 200 mL of (3,3,3-trifluoropropyl)magnesium bromide 0.50 M in tetrahydrofuran was charged 12.06 g of acetophenone (4) and the mixture stirred at room temperature for 4 h. The reaction was quenched by slowly pouring the mixture into 400 mL saturated ammonium chloride solution and was extracted into 400 mL ethyl acetate, and washed with water and brine to a neutral pH. The ethyl acetate extracts were then dried over sodium sulfate, filtered and concentrated in the rotary evaporator affording 21 g of 5,5,5-trifluoro-2-phenylpentan-2-ol (5) (~96%) yield of as an amber oil which was used without further purification. $^1$H NMR (500 MHz, Acetone-$d_6$): δ 7.50 (s, 3H), 7.23 (s, 2H), 4.30 (s, 1H, OH), 2.41-2.20 (m, 1H), 2.18-1.81 (m, 2H), 1.79-1.63 (m, 1H), 1.56 (s, 3H).

21 g of 5,5,5-trifluoro-2-phenylpentan-2-ol (5) and 11.6 g of triethylamine dissolved in 40 mL of methylene chloride was slowly charged into flask equipped with magnetic stirrer and 11 ml of methacryloyl chloride in 100 mL of dichloromethane cooled down to 0° C. The resultant mixture slowly warmed up to room temperature and allowed to stir at this temperature for 12 hours. Upon completion of the reaction as confirmed by thin layer chromatography, the mixture was quenched by pouring into 400 mL of deionized water and extracted further into methylene chloride. The methylene chloride extracts were then dried over sodium sulfate, filtered and concentrated in vacuo affording 20 g of 5,5,5-trifluoro-2-phenylpentan-2-yl methacrylate (LG2) (~72% yield) of as an amber oil. The oil was purified further by passing through a silica gel plug and eluting with a 70:30 mixture of hexanes/methylene chloride to afford 19 g of pure product. $^1$H NMR (500 MHz, Acetone-$d_6$): δ 7.32 (s, 3H), 7.24 (s, 2H), 6.11 (s, 1H, vinyl), 5.6 (s, 1H, vinyl), 2.45-2.05 (m/m, 5H), 1.92 (s, 3H), 1.87 (s, 3H).

Comparative Polymer Example

Three separate solutions for heel, feed and initiator were made. The heel solution was prepared by dissolving 1.93 g 2-phenyl-2-propyl methacrylate (PPMA), 1.68 g alpha (gamma-butyrolactone) methacrylate (α-GBLMA), 2.84 g 3,5-bis(1,1,1,3,3,3-hexafluoro-2-ol)cyclohexyl methacrylate (DiHFA), 1.63 g phenyl dibenzothiophenium-1,1-difluoro-2-(methacryloyloxy)ethane-1-sulfonate (PDBT-$F_2$) in 66.58 g ethyl lactate/gamma butyrolactone (GBL) (70:30 v/v). The feed solution was prepared by dissolving 30.06 g PPMA, 33.11 g α-GBLMA, 20.81 g DiHFA, 9.0 g PDBT-$F_2$, 131 g ethyl lactate/GBL (70:30 v/v). The initiator solution was prepared by dissolving 10.6 g VAZO V-65 in 22 g acetonitrile/tetrahydrofuran (THF; 1:2 v/v).

A 500 ml, three neck round bottom flask set up with a water condenser was charged with the heel solution and the contents were heated to 75° C. Once an equilibrium temperature was attained, the feed solution and initiator solution were fed into the reactor at a constant feed rate over four hours using two separate feed lines. The contents were stirred at 75° C. for additional 2 hours. Aliquots were analyzed by GPC and HPLC to determine Mw and monomer consumption, respectively, throughout the course of reaction.

Once all the solution was fed into the reactor, 0.05 g inhibitor (hydroquinone) was added to the reactor and the contents were cooled to room temperature. Precipitation was carried out in 10 volumes of diisopropyl ether/methanol (95:5 v/v). The final polymer was dried in vacuum overnight.

Example 1

Polymer A

Three separate solutions for heel, feed and initiator were made. The heel solution was prepared by dissolving 3.42 g 1-(3,5-bis(trifluoromethyl)benzyl)cyclopentyl methacrylate, 1.68 g α-GBLMA, 2.84 g DiHFA, 1.63 g PDBT-$F_2$ in 66.58 g ethyl, lactate/GBL (70:30 v/v). The feed solution was prepared by dissolving 39.33 g 1-(3,5-bis(trifluoromethyl)benzyl)cyclopentyl methacrylate, 33.11 g α-GBLMA, 20.81 g DiHFA, 9.0 g PDBT-$F_2$ 131 g ethyl lactate/GBL (70:30 v/v).

The initiator solution was prepared by dissolving 10.6 g (0.04 mol) V-65 in 22 g acetonitrile/THF (1:2 v/v).

A 500 ml, three neck round bottom flask set up with a water condenser was charged with the heel solution and the contents were heated to 75° C. Once an equilibrium temperature was attained, the feed solution and initiator solution were fed into the reactor at a constant feed rate over four hours using two separate feed lines. The contents were stirred at 75° C. for additional 2 hours. Various aliquots were withdrawn from the reactor and were analyzed by GPC and HPLC for Mw determination and the monomer consumption respectively through the course of reaction.

Once all the solution was fed into the reactor, 0.05 g inhibitor (hydroquinone) was added to the reactor and the contents were cooled to room temperature. Precipitation was carried out in 10 volumes diisopropyl ether/methanol (95:5 v/v). The final polymer was dried in vacuum overnight.

Example 2

Polymer B

Three separate solutions for heel, feed and initiator were made. The heel solution was prepared by dissolving 2.57 g 5,5,5-trifluoro-2-phenylpentan-2-yl methacrylate 1.68 g (0.009 mol) α-GBLMA, 2.84 g DiHFA, 1.63 g PDBT-$F_2$ in 66.58 g ethyl, lactate/GBL (70:30 v/v). The feed solution was prepared by dissolving 29.55 g LG2, 33.11 g α-GBLMA, 20.81 g DiHFA, 9.0 g PDBT-$F_2$ 131 g ethyl lactate/GBL (70:30 v/v). The initiator solution was prepared by dissolving 10.6 g V-65 in 22 g acetonitrile/THF (1:2 v/v).

A 500 ml, three neck round bottom flask set up with a water condenser was charged with the heel solution and the contents were heated to 75° C. Once an equilibrium temperature was attained, the feed solution and initiator solution were fed into the reactor at a constant feed rate over four hours using two separate feed lines. The contents were stirred at 75° C. for additional 2 hours. Various aliquots were withdrawn from the reactor and were analyzed by GPC and HPLC for Mw determination and the monomer consumption respectively through the course of reaction.

Once all the solution was fed into the reactor, 0.05 g inhibitor (hydroquinone) was added to the reactor and the contents were cooled to room temperature. Precipitation was carried out in 10 volumes diisopropyl ether/methanol (95:5 v/v). The final polymer was dried in vacuum overnight.

Table 1 shows the physical properties of the polymers evaluated. The transmittances at 40 nm film thickness were calculated using compiled and estimated material densities (1.2 g/cm$^3$) for the respective chemical compositions.

TABLE 1

| Polymer | Mw (g/mol) | PDI (Mw/Mn) | $T_d$ (° C.) | Tg (° C.) | Calculated % T @ 40 nm |
|---|---|---|---|---|---|
| Comparative Example | 6252 | 1.63 | 150 | 115 | 80 |
| Polymer A | 6700 | 1.62 | 200 | 103 | 75 |
| Polymer B | 6595 | 1.64 | 180 | 100 | 78 |

The above polymers were then formulated and evaluated under KrF and EUV exposure conditions.

Photoresist preparation and processing. A positive-tone photoresist composition was prepared by combining in admixture 4.95 g polymer prepared as above, 0.1 g of 5 wt % a solution of Omnova PF656 surfactant in ethyl lactate, 1.0 g of 1 wt % solution of base additive (Troger's Base), 37.91 g of hydroxymethyl isobutyrate solvent (HBM) and 156 g of ethyl lactate solvent.

The resist solution was passed through a 0.01 um PTFE filter. Resist formulations were spun cast on 200 mm Si wafers coated with 25 nm of underlayer to a resist thickness of 60 nm (AR™19, Rohm and Haas Electronic Materials LLC). The films were annealed at 130° C. for 90 seconds and exposed to EUV light source (NA=0.30; Quad; 0.22σ/0.686) using both an open frame array in order to obtain a contrast curve and through a binary mask containing dark field line/space patterns. The exposed wafers were baked at 100° C. for 60 seconds and then developed with 0.26N tetramethylammonium hydroxide solution for 60 seconds.

Table 2 gives a summary of the lithographic properties of Polymers A and B and the comparative polymer. Polymer B exhibits a much lower resolution limit of 17 nm relative to Polymer A, and significantly lower distinctive improvement in the resolution limit and LWR with Polymer B compared to the Comparative example and Polymer A.

TABLE 2

| Polymer | Resolution Limit (nm) | LWR (nm) | Sensitivity (EUV $E_0$) | Sensitivity (KrF $E_0$) |
|---|---|---|---|---|
| Comparative Example | 22 | 6.4 | 4<br>2 × base | 25<br>2 × base |
| Polymer A | 24 | 7.5 | 6.2<br>1 × base | 60<br>1 × base |
| Polymer B | 17 | 4.0 | 6.8<br>2 × base | 37<br>2 × base |

Figure 1:
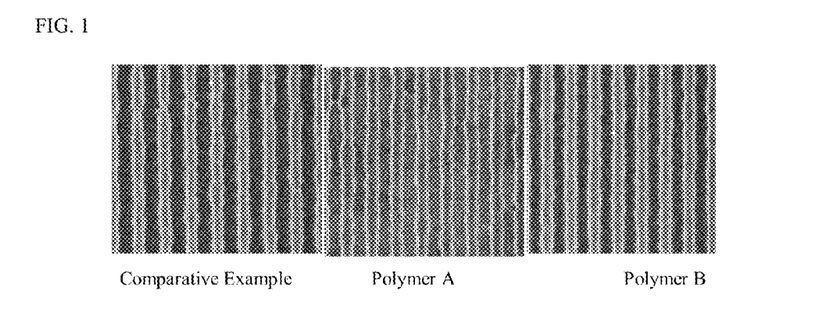
FIG. 1 shows a scanning electron micrograph (SEM) comparison of 28 nm lines and space (1:1 pitch) under EUV exposure using dipole illumination.
Figure 2:
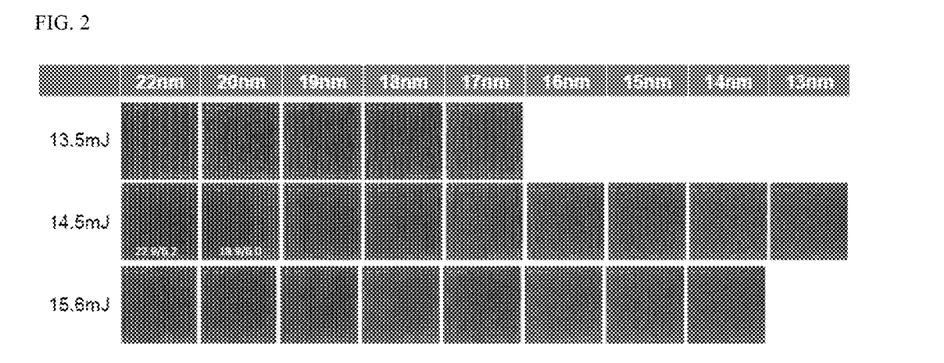
FIGS. 2 and 3 show top down SEM images showing the exposure dose dependency (FIG. 2) and focus dependency (FIG. 3) of an exemplary EUV copolymer at 35 nm film thickness using a pseudo Phase Shift Mask.

FIG. 2 shows a side-by-side comparison of 28 nm 1:1 lines/space at EUV exposure (dipole illumination) for the comparative example, Polymer A, and Polymer B. Photoresist containing Polymer B (with monomer LG2) has a lower degree of LWR than either the Comparative Example or Polymer A (with monomer LG1). As seen in Table 2, the top down SEM images of 28 nm hp line/space show that Polymer B has the best performance with a LWR of 4.0 compared to the Comparative example and Polymer A with a LWR of 6.4 and 7.5 respectively.

However, as seen in Table 2, no notable improvement in sensitivity was observed. The lack of improvement in sensitivity was a result of the lower deprotection efficiency of the two new leaving groups as compared to the leaving group on the conventional Polymer A. The acid-catalyzed deprotection rates of the three leaving groups were measured using $^1$H NMR by dissolving the various monomers in a 50/50 dioxane-$d_6$/$D_2$O mixture. The mixture was stirred to form a clear, colorless solution, loaded into a 5 mm NMR tube, and stored in a −40° C. freezer until use. The leaving group deprotection rate was monitored at room temperature and at 60° C. by adding an equimolar amount of methane sulfonic acid to the monomer solution in dioxane-$d_6$/$D_2$O. The probe of a Varian 400-MR NMR spectrometer was heated to 60° C., the methane sulfonic acid was added to the monomer solution in the NMR tube and the sample loaded into the spectrometer. To cater for the time required by the instrument to lock on the sample, the data collection was stopped after five minutes total from when the sample was loaded into the instrument. The deprotection amount was quantified by the appearance of the vinyl peak formation of methacrylic acid.

Table 3 shows a summary of leaving group deprotection kinetics study. As is shown in Table 3, the conventional Polymer A has a leaving group with the highest deprotection efficiency because there is evidence of 10% leaving group deprotection at room temperature compared to the other leaving groups evaluated which require some heat for deprotection to Occur.

TABLE 3

| Leaving group | 23° C. | 60° C. |
|---|---|---|
| Comparative example | 10% deprotected | 45% deprotected |
| Leaving group 1 | 0% deprotected | 10% deprotected |
| Leaving group 2 | 0% deprotected | 28% deprotected |

The improved pattern collapse margin is believed to occur as a result of increased hydrophobicity that stems from the structure of added chromophore (evidence also through lower $T_g$) that results in slower acid diffusion through the exposed regions compared to the conventional Polymer A.

Figure 3:
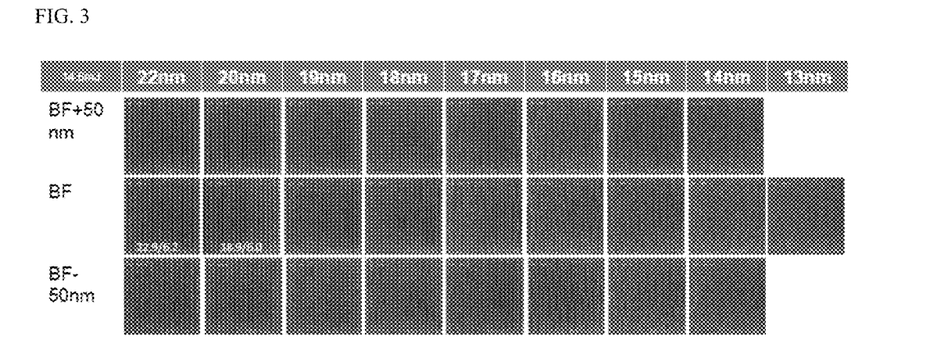

FIGS. 2 and 3 show top down SEM images of dose dependency (FIG. 2) and focus dependency (FIG. 3) of Polymer B using phase shift masking at 35 nm film thickness (EUV exposure). As seen in the Figures, Polymer B exhibits a wide exposure latitude (22 nm to 13 nm feature sizes at 14.5 mJ/cm² exposure dose) and wide focus latitude at 14.5 mJ/cm² over the same feature sizes.

All ranges disclosed herein are inclusive of the endpoints, and the endpoints are independently combinable with each other. The suffix "(s)" as used herein is intended to include both the singular and the plural of the term that it modifies, thereby including at least one of that term. "Optional" or "optionally" means that the subsequently described event or circumstance can or cannot occur, and that the description includes instances where the event occurs and instances where it does not. As used herein, "combination" is inclusive of blends, mixtures, alloys, or reaction products.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

The invention claimed is:

1. A copolymer comprising the polymerized product of:
   an electron-sensitizing acid deprotectable monomer having the formula (XX) and a comonomer:

(XX)

wherein $R^a$ is H, F, —CN, $C_{1-10}$ alkyl, or $C_{1-10}$ fluoroalkyl; and
wherein
$R^x$ and $R^y$ are each independently a substituted or unsubstituted $C_{1-10}$ alkyl group or $C_{3-10}$ cycloalkyl group, which together form a ring; and $R^z$ is (i) a group comprising (a) a substituted or unsubstituted $C_{6-20}$ aromatic-containing group, (b) $C_{1-6}$ perfluoroalkyl or $C_{3-6}$ perfluorocycloalkyl attached to the $C_{6-20}$ aromatic-containing group, and (c) a $C_{1-10}$ alkylene group or a $C_{3-10}$ cycloalkylene group connecting the $C_{6-20}$ aromatic-containing group and the carbon atom to which substituents $R^x$ and $R^y$ are attached, or (ii) $C_{6-20}$ cycloaliphatic-containing group comprising $C_{3-6}$ perfluorocycloalkyl.

2. The copolymer of claim 1, wherein $R^z$ comprises $C_{1-6}$ perfluoroalkyl.

3. The copolymer of claim 1, wherein $R^z$ is a group comprising (a) a substituted or unsubstituted $C_{6-20}$ aromatic-containing group, (b) $C_{1-6}$ perfluoroalkyl attached to the $C_{6-20}$ aromatic-containing group, and (c) a $C_{1-10}$ alkylene group or a $C_{3-10}$ cycloalkylene group connecting the $C_{6-20}$ aromatic-containing group and the carbon atom to which substituents $R^x$ and $R^y$ are attached.

4. The copolymer of claim 1, wherein the comonomer comprises at least one of the following monomers:
   an acid-deprotectable monomer having the formula (V), a lactone-containing monomer of the formula (VI), a base-soluble monomer of formula (VII), a photoacid-generating monomer of the formula (VIII), or a combination comprising at least one of the foregoing monomers,

(V)

(VI)

(VII)

(VIII)

wherein
each $R^a$ is independently H, F, —CN, $C_{1-10}$ alkyl, or $C_{1-10}$ fluoroalkyl,
each $R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to an adjacent $R^b$ to form a cyclic structure,
L is a monocyclic, polycyclic, or fused polycyclic $C_{4-20}$ lactone-containing group, W is a halogenated or non-halogenated, aromatic or non-aromatic $C_{2-50}$ hydroxyl-containing organic group having a pKa of less than or equal to 12, Q is ester-containing or non-ester containing and fluorinated or non-fluorinated and is $C_{1-20}$ alkylene, $C_{3-20}$ cycloalkylene, $C_{6-20}$ arylene, or $C_{7-20}$ aralkylene group, A is ester-containing or non ester-containing and fluorinated or non-fluorinated, and is $C_{1-20}$ alkylene, $C_{3-20}$ cycloalkylene, $C_{6-20}$ arylene, or $C_{7-20}$ aralkylene, $Z^-$ is an anionic moiety comprising sulfonate, an anion of a sulfonamide, or an anion of a sulfonimide, and $G^+$ is a sulfonium or iodonium cation.

5. The copolymer of claim 4, wherein the comonomer comprises the photoacid-generating monomer of the formula (VIII).

6. A photoresist composition comprising the copolymer of claim 1.

7. The photoresist composition of claim 6, further comprising a photoacid generator.

8. A method of forming an electronic device, comprising: (a) applying a layer of a photoresist composition of claim 6 on a substrate; (b) patternwise exposing the photoresist composition layer to activating radiation; (c) developing the exposed photoresist composition layer to provide a resist relief image, and (d) etching the resist relief pattern into the underlying substrate.

9. The method of claim 8, wherein the radiation is extreme-ultraviolet or e-beam radiation.

10. A copolymer comprising the polymerized product of an electron-sensitizing acid deprotectable monomer having the formula:

or a combination thereof, and a comonomer.

11. A copolymer comprising the polymerized product of:
an electron-sensitizing acid deprotectable monomer having the formula (III) or (IV) and a comonomer:

(III)

(IV)

wherein each $R^a$ is independently H, F, —CN, $CH_3$, or $CF_3$, $R^c$ is $C_{1-10}$ alkyl or $C_{3-10}$ cycloalkyl, $R^d$, $R^e$, $R^f$, and $R^g$ are independently $C_{1-6}$ perfluoroalkyl or $C_{3-6}$ perfluorocycloalkyl, $S^2$ is a $C_{1-10}$ alkylene group, or a $C_{3-10}$ cycloalkylene group, x is an integer of from 1 to 20, y is an integer of from 1 to 20, m is an integer of from 0 to 5, n is an integer of from 1 to 5, and p is an integer of from 0 to 2x+6.

* * * * *